United States Patent
Tan et al.

(10) Patent No.: US 10,551,458 B2
(45) Date of Patent: Feb. 4, 2020

(54) METHOD AND SYSTEMS FOR ITERATIVELY RECONSTRUCTING MULTI-SHOT, MULTI-ACQUISITION MRI DATA

(71) Applicant: General Electric Company, Schenectady, NY (US)

(72) Inventors: Ek Tsoon Tan, Mechanicville, NY (US); Giang-Chau Ngo, Champaign, IL (US); Christopher Judson Hardy, Schenectady, NY (US); Thomas Kwok-Fah Foo, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 301 days.

(21) Appl. No.: 15/637,708

(22) Filed: Jun. 29, 2017

(65) Prior Publication Data

US 2019/0004132 A1 Jan. 3, 2019

(51) Int. Cl.
*G01R 33/48* (2006.01)
*G01R 33/56* (2006.01)

(52) U.S. Cl.
CPC ......... *G01R 33/4818* (2013.01); *G01R 33/56* (2013.01)

(58) Field of Classification Search
USPC .......................................................... 324/309
See application file for complete search history.

(56) References Cited

U.S. PATENT DOCUMENTS

| | | | |
|---|---|---|---|
| 6,208,139 B1 * | 3/2001 | Foo | G01R 33/561 324/307 |
| 6,341,179 B1 | 1/2002 | Stoyle | |
| 6,560,353 B1 | 5/2003 | Haacke | |
| 6,777,933 B2 | 8/2004 | Stoyle | |
| 6,850,061 B2 | 2/2005 | Stoyle | |
| 6,853,191 B1 | 2/2005 | Miller | |

(Continued)

FOREIGN PATENT DOCUMENTS

| | | | |
|---|---|---|---|
| EP | 910835 A | 4/1990 | |
| EP | 1295152 A1 | 3/2003 | |

(Continued)

OTHER PUBLICATIONS

Aguilera, Ana, et al., "A Multi-Agent Architecture and System for Dynamic Medical Knowledge Acquisition," CIMCA 2008, IAWTIC 2008, and ISE 2008, IEEE Computer Society 2008, pp. 1165-1170.

(Continued)

*Primary Examiner* — Jay Patidar

(57) ABSTRACT

A magnetic resonance (MR) imaging method performed by an MR imaging system includes acquiring MR data in multiple shots and multiple acquisitions (NEX), separately reconstructing the component magnitude and phase of images corresponding to the multiple shots and multiple NEX, removing the respective phase from each of the images, and combining, after removal of the respective phase, the shot images and the NEX images to produce a combined image. The method further includes using the combined image to calculate the full k-space data for each shot and NEX and replacing unacquired k-space data points with calculated k-space data points. The operations are repeated until the combined image reaches a convergence.

19 Claims, 9 Drawing Sheets

(56) References Cited

U.S. PATENT DOCUMENTS

| | | | |
|---|---|---|---|
| 6,975,113 B1* | 12/2005 | Gurr | G01R 33/56375 |
| | | | 324/307 |
| 6,984,981 B2 | 1/2006 | Tamez-Pena | |
| 6,998,841 B1 | 2/2006 | Tamez-Pena | |
| 7,202,663 B2 | 4/2007 | Huang | |
| 7,408,345 B2 | 8/2008 | Bammer | |
| 7,535,222 B2 | 5/2009 | Bammer | |
| 7,545,966 B2 | 6/2009 | Lewin | |
| 7,558,414 B2 | 7/2009 | Griswold | |
| 7,777,487 B2 | 8/2010 | Ying | |
| 7,860,291 B2 | 12/2010 | Hwang | |
| 7,902,825 B2 | 3/2011 | Bammer | |
| 8,310,233 B2 | 11/2012 | Trzasko | |
| 8,781,197 B2 | 7/2014 | Wang | |
| 8,934,694 B2 | 1/2015 | Chen | |
| 8,975,895 B2 | 3/2015 | Sutton | |
| 8,989,465 B2 | 3/2015 | Trzasko | |
| 9,042,623 B2 | 5/2015 | Smith | |
| 9,229,082 B2 | 1/2016 | Guo | |
| 9,285,447 B2 | 3/2016 | Zhao | |
| 2003/0130574 A1 | 7/2003 | Stoyle | |
| 2004/0012390 A1 | 1/2004 | Stoyle | |
| 2005/0074152 A1 | 4/2005 | Lewin | |
| 2005/0100202 A1 | 5/2005 | Huang | |
| 2005/0184730 A1 | 8/2005 | Tamez-Pena | |
| 2006/0122486 A1 | 6/2006 | Tamez-Pena | |
| 2007/0083114 A1 | 4/2007 | Yang | |
| 2007/0182411 A1* | 8/2007 | Bammer | G01R 33/4824 |
| | | | 324/307 |
| 2008/0063247 A1 | 3/2008 | Griswold | |
| 2008/0157767 A1 | 7/2008 | Bammer | |
| 2008/0197844 A1 | 8/2008 | Ying | |
| 2009/0001984 A1* | 1/2009 | Hwang | G01R 33/5611 |
| | | | 324/307 |
| 2010/0207629 A1 | 8/2010 | Trzasko | |
| 2011/0105884 A1 | 5/2011 | Beck | |
| 2011/0304332 A1 | 12/2011 | Mahfouz | |
| 2013/0182930 A1 | 7/2013 | Trzasko | |
| 2013/0182932 A1 | 7/2013 | Chen | |
| 2013/0214783 A1 | 8/2013 | Zhao | |
| 2013/0236075 A1 | 9/2013 | Smith | |
| 2013/0310678 A1 | 11/2013 | Balbi | |
| 2013/0343625 A1 | 12/2013 | Samsonov | |
| 2014/0266192 A1 | 9/2014 | Taviani | |
| 2014/0286560 A1 | 9/2014 | Trzasko | |
| 2015/0042329 A1 | 2/2015 | Zhang | |
| 2015/0126850 A1 | 5/2015 | Cetingul | |
| 2015/0131884 A1 | 5/2015 | Kimura | |
| 2015/0168522 A1 | 6/2015 | Gulaka | |
| 2015/0170364 A1 | 6/2015 | Kimura | |
| 2015/0198683 A1* | 7/2015 | Takeshima | G01R 33/4818 |
| | | | 324/318 |
| 2015/0279065 A1 | 10/2015 | Li | |
| 2016/0003928 A1 | 1/2016 | Chen | |
| 2017/0146630 A1* | 5/2017 | Huang | G01R 33/4818 |
| 2017/0307716 A1* | 10/2017 | De Weerdt | G01R 33/4824 |
| 2018/0217218 A1* | 8/2018 | Huang | G01R 33/5611 |

FOREIGN PATENT DOCUMENTS

| | | |
|---|---|---|
| EP | 1451778 B1 | 11/2005 |
| EP | 1451777 B1 | 2/2006 |
| EP | 1623245 A2 | 2/2006 |
| EP | 2183612 A2 | 5/2010 |
| EP | 2283373 A2 | 2/2011 |
| EP | 2098990 B1 | 9/2011 |
| EP | 2660618 A1 | 11/2013 |
| EP | 2773985 A4 | 5/2015 |
| EP | 2400934 A4 | 7/2015 |
| EP | 2924457 B1 | 11/2016 |
| WO | 2001075483 A1 | 10/2001 |
| WO | 2003050762 A1 | 6/2003 |
| WO | 2003050761 A3 | 12/2003 |
| WO | 2005047919 A1 | 5/2005 |
| WO | 2004104611 A3 | 7/2005 |
| WO | 2008033165 A3 | 11/2008 |
| WO | 2008138174 A1 | 11/2008 |
| WO | 2009027899 A3 | 4/2009 |
| WO | 2009088524 A1 | 7/2009 |
| WO | 2009134820 A3 | 12/2009 |
| WO | 2010099360 A1 | 9/2010 |
| WO | 2013067546 A1 | 5/2013 |
| WO | 2014154544 A1 | 10/2014 |
| WO | 2014159078 A1 | 10/2014 |
| WO | 2014160701 A3 | 11/2014 |
| WO | 2015093729 A1 | 6/2015 |
| WO | 2016001853 A1 | 1/2016 |

OTHER PUBLICATIONS

Chang et al., "Nonlinear Phase Correction With an Extended Statistical Algorithm", IEEE Transactions on Medical Imaging, vol. 24, Issue 6, pp. 791-798, Jun. 2005.

Chen et al., "A Robust Multi-Shot Scan Strategy for High Resolution Diffusion Weighted MRI Enabled by Multiplexed Sensitivity-Encoding (MUSE)", NeuroImage, http://www.sciencedirect.com/science/article/pii/S1053811913000852, vol. 72, pp. 41-47, May 15, 2013.

Gao, Jinsheng, et al., "A Reasoning System about Knowledge Acquisition in Bi-Agent Interaction," 8th International Conference on Advanced Computational Intelligence Chiang Mai, Thailand, Feb. 14-16, 2016, IEEE, pp. 412-417.

Goh, Ong Sing, et al., "An Embodied Conversational Agent for Intelligent Web Interaction on Pandemic Crisis Communication," IEEE Computer Society Proceedings of the 2006 IEEE/WIC/ACM International Conference on Web Intelligence and Intelligent Agent Technology (4 pages).

Noll et al., "Conjugate Phase MRI Reconstruction With Spatially Variant Sample Density Correction", IEEE Transactions on Medical Imaging, vol. 24, Issue 24, pp. 325-336, Mar. 2005.

Zhu et al., "Hybrid-Space SENSE Reconstruction for Simultaneous Multi-Slice MRI", IEEE Transaction son Medical Imaging, vol. 35, Issue 8, pp. 1824-1836, Aug. 2016.

* cited by examiner

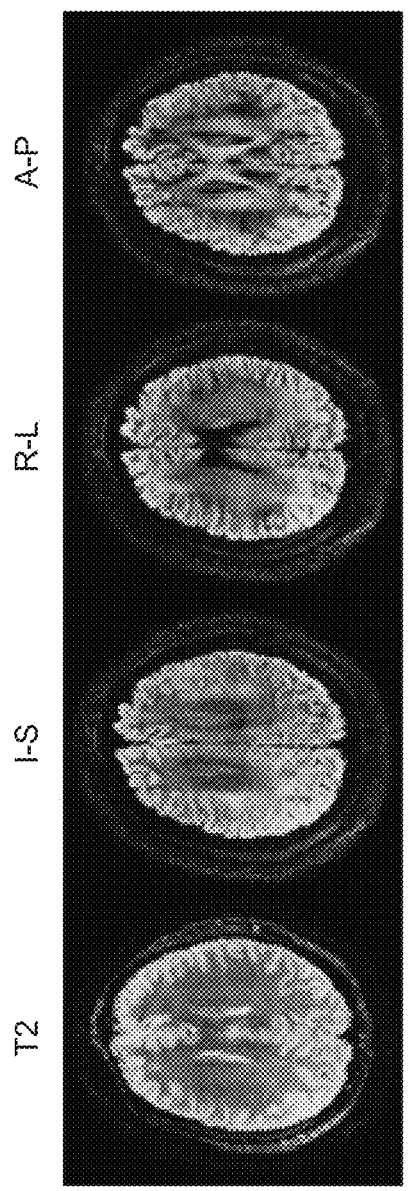
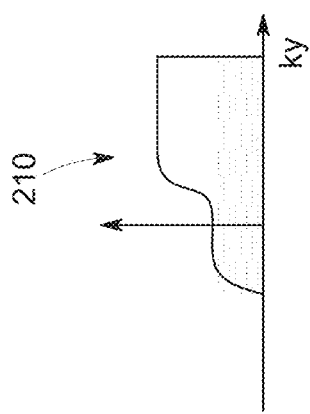
FIG. 7

METHOD AND SYSTEMS FOR ITERATIVELY RECONSTRUCTING MULTI-SHOT, MULTI-ACQUISITION MRI DATA

BACKGROUND

In general, magnetic resonance imaging (MRI) examinations are based on the interactions among a primary magnetic field, a radiofrequency (RF) magnetic field, and time varying magnetic gradient fields with gyromagnetic material having nuclear spins within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

In MRI, the signals that are detected are used to fill k-space, which is in a general sense related to an MR image by a Fourier transform. Generally, k-space contains encoded data and when transformed into the image space, is complex—it includes both magnitude and phase. Each of the magnitude and the phase can be reconstructed to produce respective images.

Unfortunately, the signals collected during MRI sequences will almost certainly include noise and certain distortions (e.g., due to fluctuations in magnetic field or movement), which if left uncorrected can reduce image quality. Various techniques have been developed to enhance image quality by increasing the signal-to-noise ratio (SNR) of the acquired data while reducing image distortions. However, such techniques may be inadequate or are subject to further improvement.

BRIEF DESCRIPTION

In one embodiment, a magnetic resonance (MR) imaging method performed by an MR imaging system includes acquiring MR data in multiple shots and multiple acquisitions (NEX) using the MR imaging system, wherein each shot of the multiple shots results in the acquisition of a partial k-space data set obtained by coils of the MR imaging system, and wherein each NEX comprises a full set of the multiple shots; processing the MR data using the MR imaging system according to an iterative process comprising: reconstructing magnitude and phase of an image from each shot and acquisition separately; applying a phase correction to the respective image for each shot and each acquisition; combining images from each shot and NEX to form a combined image; using the combined image to estimate full k-space data for each coil of the MR imaging system, each shot, and each NEX; and projecting the acquired k-space data onto the estimated full k-space data by replacing corresponding estimated portions of k-space with portions of k-space that were acquired to generate a full hybrid k-space data set.

In another embodiment, a magnetic resonance (MR) imaging system includes an MR scanner communicatively coupled to control and analysis circuitry, wherein the control and analysis circuitry is programmed to: cause the MR scanner to acquire MR data in multiple shots and multiple acquisitions (NEX) such that each shot of the multiple shots results in the acquisition of a partial k-space data set obtained by coils of the MR imaging system, and such that each NEX comprises a full set of the multiple shots; reconstruct magnitude and phase of an image from each shot and acquisition separately; applying a phase correction to the respective image for each shot and each acquisition; combine images from each shot and NEX to form a combined image; use the combined image to estimate full k-space data for each coil of the MR imaging system, each shot, and each NEX; and project the acquired k-space data onto the estimated full k-space data by replacing corresponding estimated portions of k-space with portions of k-space that were acquired to produce a full hybrid k-space data set.

In another embodiment, a method of correcting diffusion weighted magnetic resonance (MR) data using control and analysis circuitry associated with an MR imaging system includes obtaining diffusion weighted MR data corresponding to multiple shots and multiple acquisitions (NEX) acquired during an MR diffusion weighted imaging acquisition sequence in which the multiple shots and multiple NEX were performed, wherein each of the multiple shots includes undersampled k-space data acquired using coils of the MR imaging system, and wherein each of the multiple NEX includes a full set of the multiple shots; separately reconstructing the magnitude and phase of images corresponding to the diffusion weighted MR data for the multiple shots and multiple NEX; applying a phase correction to each of the images; combining, after the phase correction, the shot images and the NEX images to produce a combined image; estimating full k-space data for each coil of the MR imaging system, each of the multiple shots, and each of the multiple NEX using the combined image; projecting replacing the unacquired k-space data points in the diffusion weighted MR data with the estimated k-space data points to produce updated diffusion weighted MR data for each of the multiple shots and each of the multiple NEX.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIG. 7 is an illustration of MRI diffusion images produced after applying a sigmoid weighting function to k-space data, in accordance with an aspect of the present disclosure;

DETAILED DESCRIPTION

Figure 1:
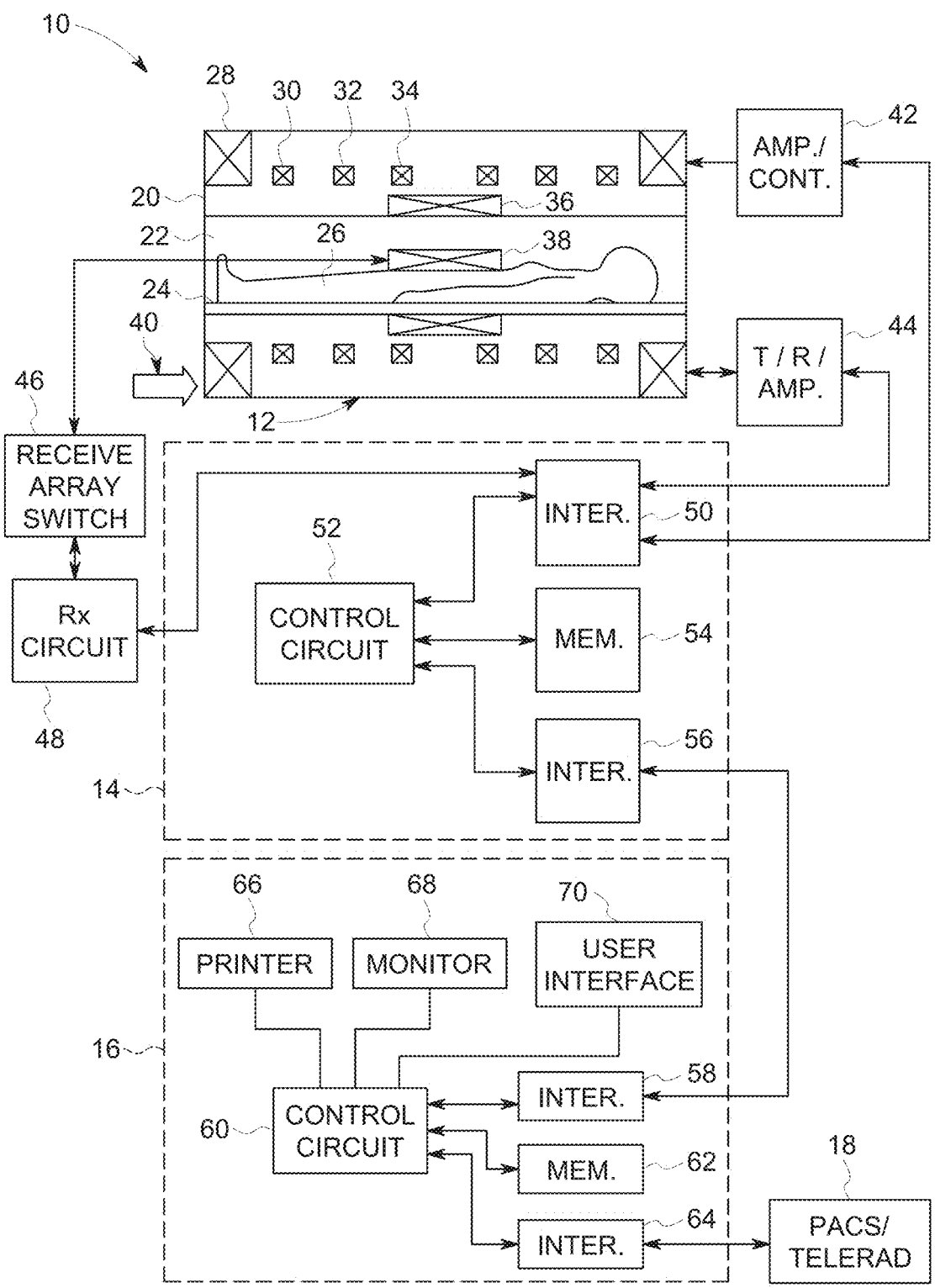
FIG. 1 illustrates an embodiment of a magnetic resonance imaging (MRI) system having a magnetic resonance scanner associated with scanner and system control circuitry configured to perform diffusion weighting MRI, in accordance with an aspect of the present disclosure.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present embodiments, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

Very high resolution and very high b-value (where the b-value reflects the strength, duration, and timing of gradient pulses used to obtain diffusion weighting) diffusion images are of intense research and commercial interest, as diffusion is useful for providing biomarkers in oncology, neurology, and neuroscience, among other disciplines. Unfortunately, acquiring diffusion weighted data during diffusion MRI sequences at high b-values or high spatial resolution comes at the expense of decreased signal-to-noise ratio (SNR). Certain diffusion imaging methods use single shot acquisition techniques to suppress motion artifacts so that diffusion data is relatively accurate. However, this typically comes at a cost of spatial resolution, image distortion, and other generally undesirable effects. Increasing the spatial resolution in single shot imaging leads to long readouts resulting in image distortions due to magnetic susceptibility or eddy currents.

Multi-shot imaging, where the acquisition of a full set of k-space data (e.g., satisfying the Nyquist criterion) is performed across multiple shots, can be used to reduce the readout duration for each shot. Each shot may include one or more RF excitation pulses (RF pulses used for nuclear spin-flip, such as 90-degree or 180-degree RF pulses). In multi-shot echo planar imaging (EPI) techniques, for example, several shots are performed to fill k-space according to the desired image field of view. In other words, the shots produce contiguous sets of k-space data, which when combined fill the k-space field of view. In certain embodiments, in each shot, the frequency encoding gradient is alternated between positive and negative frequency pulses to acquire the desired k-space coverage.

In this way, each shot acquires less than the full set of k-space data (e.g., each shot acquires a segment of k-space). In certain embodiments, the acquisition may be interleaved, where every Nth line in k-space is acquired in each shot, where N represents the number of shots per acquisition. For example, when N is 2, every other line in k-space (or, more generally, a portion of k-space) is acquired per shot. Unfortunately, multi-shot imaging comes at the cost of scan time, and phase difference occurs between shots, meaning that additional processing is generally performed during reconstruction (as opposed to using an FFT on the digitized data for a single shot acquisition).

Multi-shot acquisition generally reduces image distortion, while multi-acquisition averaging can be used to increase signal (where multi-acquisition refers to the re-acquisition of the same image using an additional set of multiple shots). It is presently recognized, however, that in diffusion MRI, combining multi-shot and multi-acquisition signals can result in signal loss due to phase inconsistencies between shots and acquisitions. The present disclosure provides, among other things, systems and methods for combining multiple shots and multiple acquisitions, while correcting for inconsistent phase.

One method to combine multiple images is to average the image magnitude. Thus, in certain DWI techniques, the phase information may be discarded and only the magnitude of the signal is kept for further processing. However, taking the magnitude of the signal alters the noise distribution, especially in the low SNR regime. Instead of a Gaussian distribution, the noise tends to have a Rician distribution resulting in bias in diffusion weighted imaging and therefore, there is a bias when performing magnitude averaging.

To avoid the bias caused by the magnitude operator, another strategy for combining the images is to average the complex data (including both magnitude and phase) directly. However due to motion (bulk motion, cardiac pulsation, breathing), phase information differs between images and signal cancellation due to phase dispersion occurs when complex averaging is performed.

One way to avoid or minimize signal cancellation is to estimate the phase of the image and remove it from the complex data, before combining data from multiple shots or NEX. When the phase is estimated and removed from the complex MRI data, all the information can then be considered to be contained in the real part and the imaginary part can be considered as noise. Therefore, the bias introduced by taking the magnitude as referenced above is avoided by taking the real part of the image instead. Thus, complex averaging can be performed without any signal loss due to phase dispersion.

In accordance with certain embodiments of the present disclosure, MRI data acquired from a multi-shot, multi-acquisition technique is processed by reconstructing images from each shot and each acquisition independently, and applying phase correction to each image. The images are combined, and the combined image is used to obtain an estimate of the unacquired data of each shot and each acquisition. The process can proceed iteratively, where the unacquired data is replaced with the estimate, and the process is repeated until convergence to a predetermined criterion. Once convergence is reached, the images, which may be diffusion weighted MRI images, or the updated diffusion weighted data corresponding to the MRI images, may be processed to produce apparent diffusion coefficient (ADC) maps, which may have diagnostic utility.

The embodiments described herein may be performed by a magnetic resonance imaging (MRI) system, wherein specific imaging routines (e.g., diffusion MRI sequences) are initiated by a user (e.g., a radiologist). Thus, the MRI system may perform data acquisition, data construction, and in certain instances, image synthesis. Accordingly, referring to FIG. 1, a magnetic resonance imaging system 10 is illustrated schematically as including a scanner 12, scanner control circuitry 14, and system control circuitry 16. According to the embodiments described herein, the MRI system 10 is generally configured to perform MR imaging, such as imaging sequences for diffusion imaging. For example, the system 10 may generate diffusion weighted images in which tissues that have either higher or lower water self-diffusion characteristics relative to other tissues are emphasized.

System 10 additionally includes remote access and storage systems or devices such as picture archiving and communication systems (PACS) 18, or other devices such as teleradiology equipment so that data acquired by the system 10 may be accessed on- or off-site. In this way, MR data may be acquired, followed by on- or off-site processing and evaluation. While the MRI system 10 may include any suitable scanner or detector, in the illustrated embodiment, the system 10 includes a full body scanner 12 having a housing 20 through which a bore 22 is formed. A table 24 is moveable into the bore 22 to permit a patient 26 to be positioned therein for imaging selected anatomy within the patient.

Scanner 12 includes a series of associated coils for producing controlled magnetic fields for exciting the gyromagnetic material within the anatomy of the subject being imaged. Specifically, a primary magnet coil 28 is provided for generating a primary magnetic field, BO, which is generally aligned with the bore 22. A series of gradient coils 30, 32, and 34 permit controlled magnetic gradient fields to be generated for positional encoding of certain of the gyromagnetic nuclei within the patient 26 during examination sequences. A radio frequency (RF) coil 36 is configured to generate radio frequency pulses for exciting the certain gyromagnetic nuclei within the patient. In addition to the coils that may be local to the scanner 12, the system 10 also includes a set of receiving coils 38 (e.g., an array of coils) configured for placement proximal (e.g., against) to the patient 26. As an example, the receiving coils 38 can include cervical/thoracic/lumbar (CTL) coils, head coils, single-sided spine coils, and so forth. Generally, the receiving coils 38 are placed close to or on top of the patient 26 so as to receive the weak RF signals (weak relative to the transmitted pulses generated by the scanner coils) that are generated by certain of the gyromagnetic nuclei within the patient 26 as they return to their relaxed state.

The various coils of system 10 are controlled by external circuitry to generate the desired field and pulses, and to read emissions from the gyromagnetic material in a controlled manner. In the illustrated embodiment, a main power supply 40 provides power to the primary field coil 28. A driver circuit 42 provides power to pulse the gradient field coils 30, 32, and 34. Such a circuit may include amplification and control circuitry for supplying current to the coils as defined by digitized pulse sequences output by the scanner control circuit 14, which in one embodiment may be a diffusion imaging module. Another control circuit 44 is provided for regulating operation of the RF coil 36. Circuit 44 includes a switching device for alternating between the active and inactive modes of operation, wherein the RF coil 36 transmits and does not transmit signals, respectively. Circuit 44 also includes amplification circuitry configured to generate the RF pulses. Similarly, the receiving coils 38 are connected to switch 46, which is capable of switching the receiving coils 38 between receiving and non-receiving modes. Thus, the receiving coils 38 resonate with the RF signals produced by relaxing gyromagnetic nuclei from within the patient 26 while in the receiving mode, and they do not resonate with RF energy from the transmitting coils (i.e., coil 36) so as to prevent undesirable operation while in the non-receiving mode. Additionally, a receiving circuit 48 is configured to receive the data detected by the receiving coils 38, and may include one or more multiplexing and/or amplification circuits.

It should be noted that while the scanner 12 and the control/amplification circuitry described above are illustrated as being coupled by a single line, that many such lines may occur in an actual instantiation. For example, separate lines may be used for control, data communication, and so on. Further, suitable hardware may be disposed along each type of line for the proper handling of the data. Indeed, various filters, digitizers, and processors may be disposed between the scanner and either or both of the scanner and system control circuitry 14, 16. By way of non-limiting example, certain of the control and analysis circuitry described in detail below, although illustrated as a single unit, includes additional hardware such as image reconstruction hardware configured to perform the data processing techniques described herein.

As illustrated, scanner control circuit 14 includes an interface circuit 50, which outputs signals for driving the gradient field coils and the RF coil and for receiving the data representative of the magnetic resonance signals produced in examination sequences. By way of non-limiting example, the scanner control circuitry 14 may accomplish diffusion weighting by causing the gradient coils 30, 32, 34 to emit a pair of large gradient pulses bracketing a refocusing RF pulse emitted by the RF coil 36. Because spins of the gyromagnetic nuclei in the patient 26 undergoing irregular motion due to diffusion are not completely re-phased by the second gradient pulse of the pair, signal from these spins is attenuated such that tissues with higher water diffusion experience increased signal loss.

The interface circuit 50 is coupled to a control and analysis circuit 52. The control and analysis circuit 52 executes the commands for driving the circuit 42 and circuit 44 based on defined protocols selected via system control circuit 16. Control and analysis circuit 52 also serves to receive the magnetic resonance signals and performs subsequent processing before transmitting the data to system control circuit 16. Scanner control circuit 14 also includes one or more memory circuits 54, which store configuration parameters, pulse sequence descriptions, examination results, and so forth, during operation. As noted above, in one embodiment, the scanner control circuit 14 may correspond to all or a part of a diffusion imaging module.

Interface circuit 56 is coupled to the control and analysis circuit 52 for exchanging data between scanner control circuit 14 and system control circuit 16. In certain embodiments, the control and analysis circuit 52, while illustrated as a single unit, may include one or more hardware devices. The system control circuit 16 includes an interface circuit 58, which receives data from the scanner control circuit 14 and transmits data and commands back to the scanner control circuit 14. The interface circuit 58 is coupled to a control and analysis circuit 60 which may include a CPU in a multi-purpose or application specific computer or workstation. Control and analysis circuit 60 is coupled to a memory circuit 62 to store programming code for operation of the MRI system 10 and to store the processed image data for later reconstruction, display and transmission. The programming code may execute one or more algorithms that, when executed by a processor, are configured to perform reconstruction of acquired data. This reconstruction may be used to obtain both angular and radial information associated with incoherent motion (e.g., diffusion) of the gyromagnetic nuclei throughout the patient's tissue.

An additional interface circuit 64 may be provided for exchanging image data, configuration parameters, and so forth with external system components such as remote access and storage devices 18. Finally, the system control and analysis circuit 60 may include various peripheral devices for facilitating operator interface and for producing hard copies of the reconstructed images. In the illustrated embodiment, these peripherals include a printer 66, a monitor 68, and user interface 70 including devices such as a keyboard or a mouse.

It should be noted that the MRI system described is merely intended to be exemplary only, and other system types, such as so-called "open" MRI systems may also be used. Similarly, such systems may be rated by the strength of their primary magnet, and any suitably rated system capable of carrying out the data acquisition and processing described below may be employed. Indeed, at least a portion of the methods disclosed herein may be performed by the system 10 described above with respect to FIG. 1. That is, the MRI system 10 may perform the acquisition and reconstruction techniques described herein. It should be noted that subsequent to the acquisitions described herein, the system 10 may simply store the acquired data for later access locally and/or remotely, for example in a memory circuit (e.g., memory 62). Thus, when accessed locally and/or remotely, the acquired data may be manipulated by one or more processors contained within an application-specific or general-purpose computer. The one or more processors may access the acquired data and execute routines stored on one or more non-transitory, machine readable media collectively storing instructions for performing methods including the multi-shot, multi-acquisition image averaging techniques described herein. As an example, the methods described herein may be performed by control and analysis circuitry associated with or otherwise communicatively coupled to the MR scanner 12.

Figure 2:
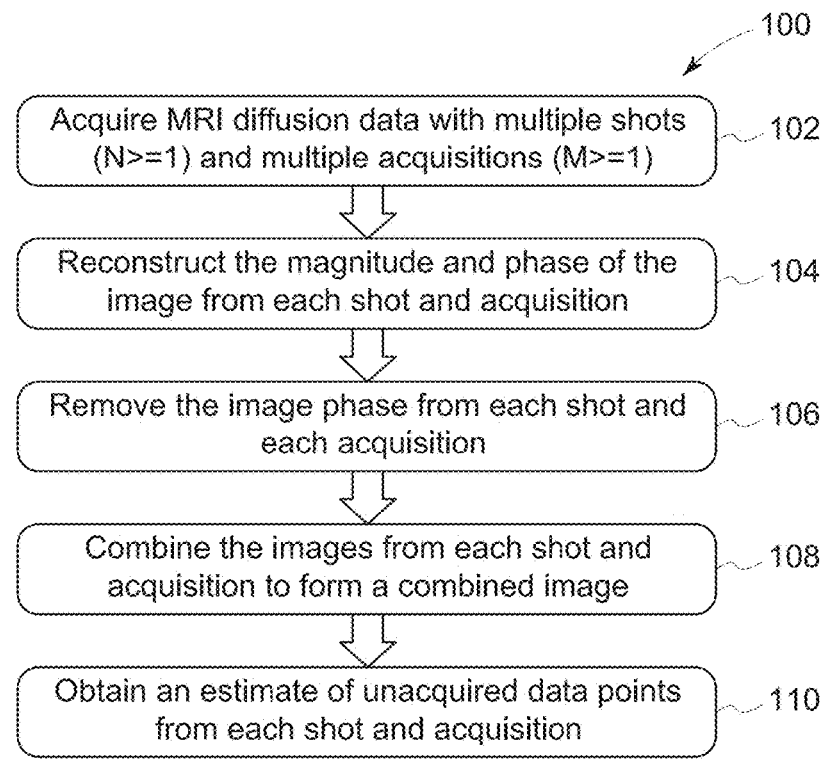
FIG. 2 is a process flow diagram depicting an embodiment of an MRI method in which multiple shots and multiple acquisitions are used to acquire MRI diffusion data, in accordance with an aspect of the present disclosure.

An example magnetic resonance imaging (MRI) method 100 in accordance with present embodiments is illustrated in FIG. 2 as a process flow diagram. Generally, the method 100 involves combining images from multiple shots and multiple excitations to produce an image. As illustrated, the method 100 includes acquiring (block 102) MRI data (e.g., MRI diffusion-weighted data) using multiple shots and multiple acquisitions. The acquisition according to block 102 may include performing multiple acquisitions of an image field of view, where each acquisition includes multiple shots to obtain a desired amount of k-space coverage corresponding to the desired field of view. Each shot may traverse only a portion of k-space, and therefore produces an incomplete set of k-space data. Each shot collects a certain number of k-space lines, or views, which may be referred to collectively as a segment of k-space. The multiple shots of each acquisition may be such that the segments are contiguous in k-space or are interleaved in k-space. Further, in certain embodiments, the segments may partially overlap in k-space. Each shot may involve an RF excitation and additional pulses to traverse a portion of k-space.

The desired amount of k-space coverage across each acquisition may or may not satisfy the Nyquist criterion, and therefore may or may not produce an undersampled data set. Further, certain portions of k-space may be undersampled, oversampled, or sampled according to the Nyquist criterion. In accordance with one embodiment, each acquisition, including its corresponding multiple shots, may be an accelerated acquisition in which the multiple shots do not fully fill k-space. The phrase "multiple acquisitions" generally refers to the re-acquisition of data corresponding to the same image field of view. The sampling trajectory according to block 102 is not particularly limited, and may include any appropriate sampling trajectory amenable to multi-shot acquisition of a k-space plane.

The output from block 102 may include multiple k-space data sets, such as multiple segments of acquired k-space data acquired from the multiple shots, and multiple groups of segments, where each group of segments corresponds to a full k-space acquisition (or an undersampled acquisition of a k-space plane). Due to the different excitations across the multiple shots and multiple acquisitions, the shots and acquisitions produce sets of k-space data with inconsistent phase, usually resulting from movement occurring during the acquisitions. In certain embodiments, the acquisition in accordance with block 102 is performed such that there are sampled points and undersampled points of k-space in the segment or line of k-space corresponding to each shot, and/or sampled points and undersampled points of k-space in the acquisition from multiple shots. In certain embodiments, such as when the acquisition according to block 102 is a diffusion weighted imaging acquisition, the acts represented by block 102 may be an acquisition with very high spatial resolution, and very high b-values.

As illustrated, the method 100 also includes reconstructing (block 104) the magnitude and phase of the image resulting from each shot and acquisition separately. The reconstruction of block 104 may be performed via Fourier transform of the k-space data, followed by separation (e.g., calculation) of the magnitude and phase based on the Fourier transform output.

Reconstructing the magnitude and phase as set forth above is then followed by applying (block 106) phase correction to the image corresponding to each shot and acquisition. In accordance with present embodiments, applying phase correction to the image corresponding to each shot and acquisition after processing the raw k-space data (after performing reconstruction as set forth above) may avoid or reduce bias in diffusion weighted images.

After applying phase correction, the method 100 includes combining (block 108) the images from each shot and acquisition to form a combined image. The combining of images performed according to block 108 may be done such that the shots are all combined first, followed by a combination of the acquisitions, or may be done such that all acquisitions are combined first, followed by a combination of the shots. The combination of shots and acquisitions produces a combined image. In accordance with present embodiments, although the combined image produced from block 108 is produced from inputs in which image phase has been corrected, the combined image has a Gaussian noise distribution, as opposed to a Rician noise distribution as would be the case had phase been corrected before the reconstruction of block 104.

Figure 3:
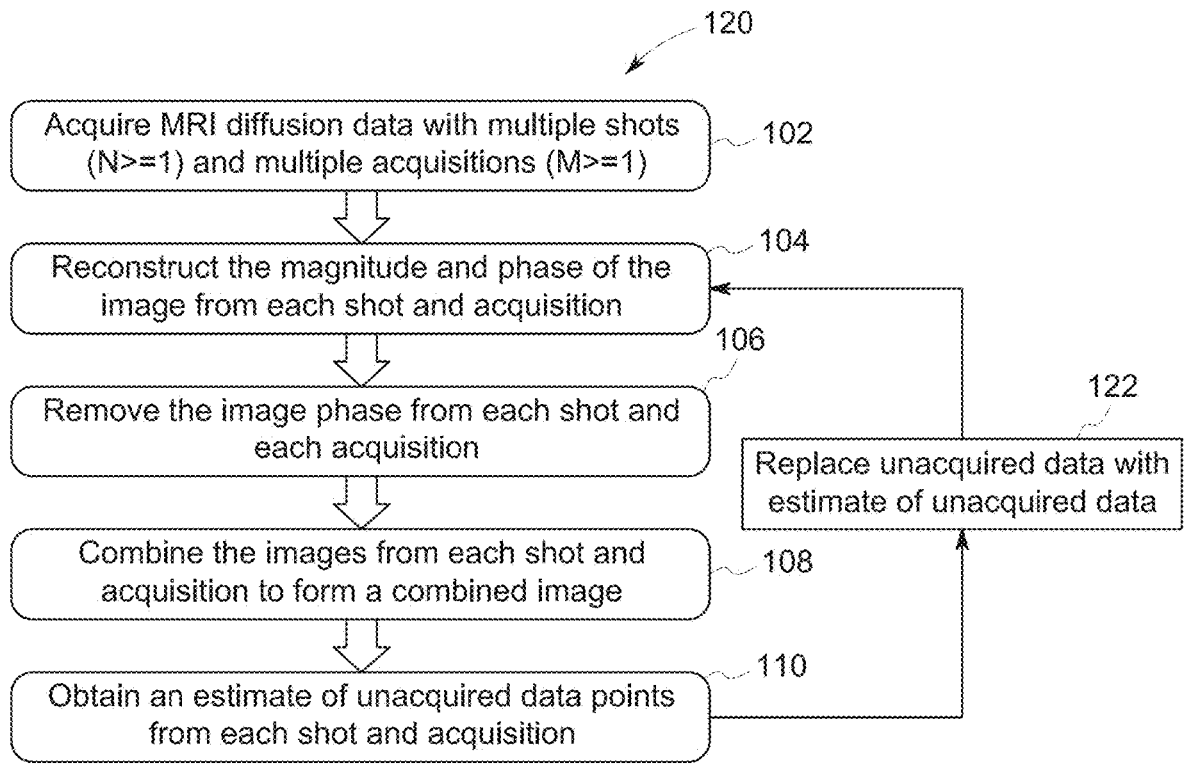
FIG. 3 is a process flow diagram depicting an embodiment of an MRI method in which multiple shots and multiple acquisitions are used to acquire MRI diffusion data, and the MRI diffusion data is updated iteratively, in accordance with an aspect of the present disclosure.

The method 100 also includes obtaining (block 110) an estimate of unacquired k-space data points from each shot and acquisition using the combined image. The method 100 of FIG. 2 may be modified to include additional steps, as shown in method 120 of FIG. 3. As shown, method 120 also includes replacing (block 122) the unacquired data points (regions of k-space where data was not acquired) with the estimates of the unacquired data points generated in block 110. Accordingly, portions of the method 120 may continue iteratively, where the input to block 104 is continually updated until a predetermined criterion or set of criteria are satisfied. That is, the input to block 104 may be such that the acts of block 104 include reconstructing the magnitude and the phase of images corresponding to each shot and NEX in which estimated k-space data points have replaced unacquired k-space data points.

In this way, the estimate of the unacquired k-space data points is iteratively updated by repeatedly reconstructing the magnitude and the phase of the images corresponding to each shot and each NEX separately, applying phase correction for the images, forming the combined image, estimating the unacquired k-space data points, and replacing the unacquired k-space data points with the estimate to produce an updated input for the reconstruction of the magnitude and the phase for each of the images. The estimate of the k-space data may be iteratively updated until the combined image reaches a convergence. It should be noted that by obtaining iterative k-space data estimates, phase is also estimated, used for reconstruction, and subsequently corrected as blocks 104, 106, and 108 are continually repeated until convergence.

As may be appreciated, the shared steps between methods 100 and 120 may be considered as related to one another during an MR imaging sequence (e.g., to obtain diffusion weighted MRI data). For example, method 100 may be performed to obtain estimated k-space data, where all inputs may be considered to represent "initial" inputs, and the process is performed only once. However, certain of the steps in method 120, specifically the acts represented by blocks 104, 106, 108, 110, and 122, may be performed iteratively. Thus, each of steps of blocks 104, 106, 108, 110, and 122 may include a first or initial pass, followed by updated passes.

As an example, the first iteration of method 120 may be considered as an initialization process, including acquiring the MR data as initial MR data in the multiple shots and multiple NEX, separately reconstructing the magnitude and phase of initial images corresponding to the multiple shots and multiple NEX, applying phase correction to each of the initial images (per NEX), and combining, after applying phase correction, the initial shot images and the initial NEX images to produce an initial combined image. Subsequent passes through the post-acquisition steps of method 120 may be considered to operate on updated (e.g., corrected) inputs. The subsequent passes generally iteratively reconstruct the acquired MR data until, for example, a predetermined convergence is reached.

Thus, the acts of block 122, when first performed, result in a replacement of the unacquired k-space data points in the initial MR data with the estimated k-space data points to produce updated MR data for each of the multiple shots and each of the multiple NEX. For instance, the acts of block 104 may be considered to include separately reconstructing, using the updated MR data, updated magnitude and updated phase of updated images corresponding to the multiple shots and multiple NEX. Block 106 may include, for example, correcting phase for each of the updated images, and block 108 may include, for example, combining, after correction of the respective updated phase, the updated shot images and updated NEX images to produce an updated combined image. Additional steps may be performed in conjunction with method 120, such as determining whether the convergence has been reached based on the updated combined image.

Several refinements may be made to the methods 100, 120 set forth above to enhance image reconstruction, phase estimation, acquisition speed and so forth. For example, the methods may incorporate strategies used in techniques such as POCS (Projection onto Convex Sets), which iteratively synthesizes missing data in a way that the synthesized data is consistent with collected data. The methods may additionally or alternatively incorporate strategies used in sensitivity encoding (SENSE)-based techniques, which involve the use of sensitivity information relating to the coils of the MR scanner (e.g., scanner 12) for image reconstruction. The methods may additionally or alternatively incorporate strategies used in self-calibrated-based techniques that do not require the use of a separate sensitivity information relating to the coils of the MR scanner (e.g., scanner 12) for image reconstruction.

Combinations of techniques such as these may also be used, which may be used to correct for the differences in phase between shots performed in accordance with block 102. Some techniques use an additional readout, a navigator to obtain the phase information, and others are self-navigated or do not use any navigators.

Multiplexed Sensitivity Encoding (MUSE) methods or POCS-based methods such as POCSMUSE or POCS-ICE (inherent correction of motion-induced phase errors) do not need a navigator to estimate the phase for each shot. They use either SENSE or POCS to obtain a non-aliased image for each shot. The POCS-based methods iteratively estimate the phase for each shot and enforce all the shots to share the same magnitude. With these methods, data with higher shot numbers can be acquired. However, these methods have only been described for multi-shot acquisition.

Figure 4:
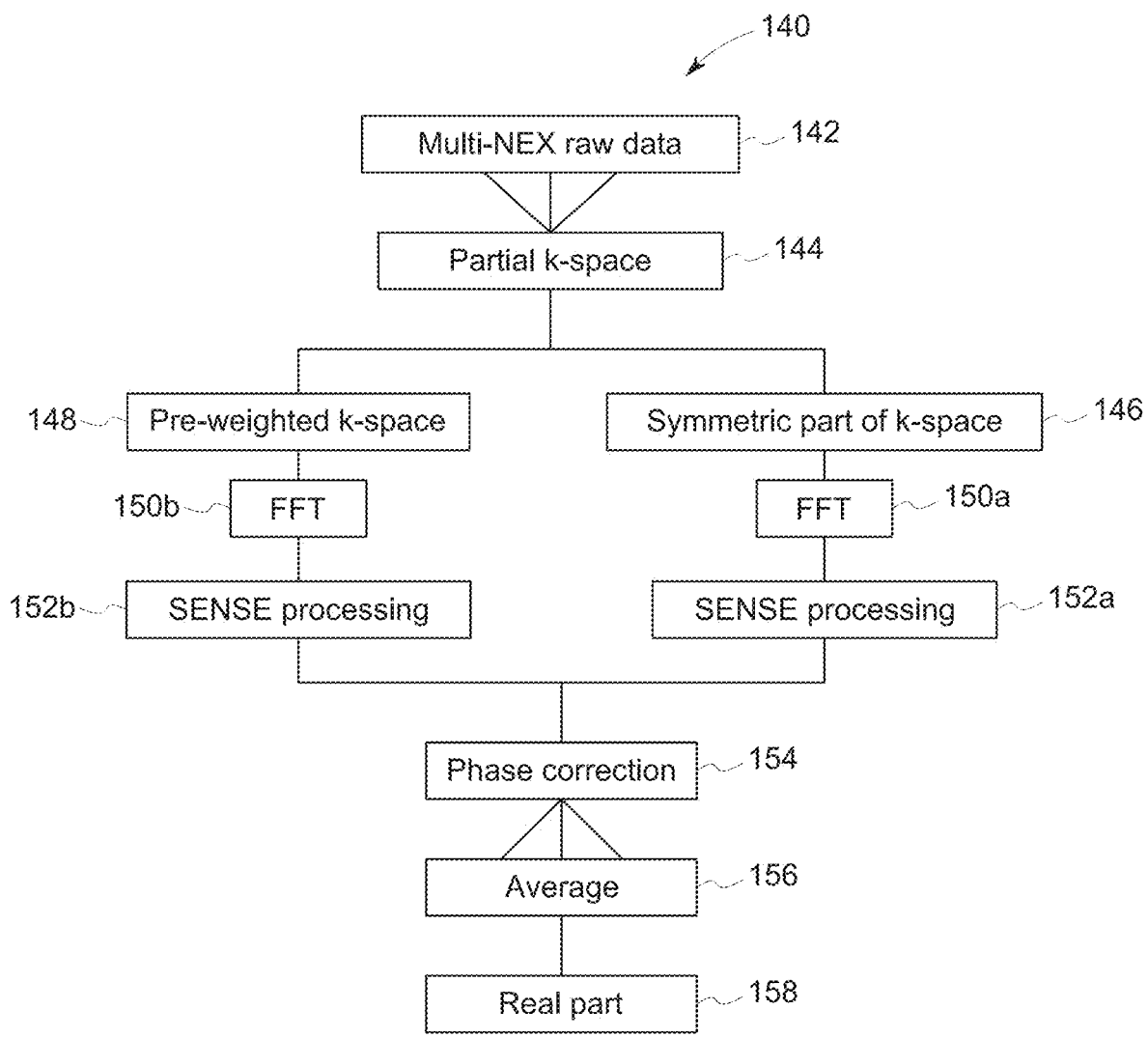
FIG. 4 is a flow diagram depicting an embodiment of a reconstruction algorithm to process multi-acquisition raw MRI data, in accordance with an aspect of the present disclosure.

An example of the manner in which the present methods may be applicable to multi-NEX acquisition is shown in FIG. 4, which depicts a reconstruction algorithm 140. In certain embodiments, the reconstruction algorithm 140 may represent all or a part of the method 100 discussed above. As illustrated, the algorithm 140 begins with multi-NEX raw data 142, which may or may not include multiple shots for each acquisition. The data 142 is combined to produce a set of partial k-space data 144, including data points that are sampled and points that are not sampled.

Because the acquired multi-NEX data 142 is typically only partial k-space data, Homodyne reconstruction may additionally be required to recover the unacquired k-space data 144 is used to produce a symmetric set of k-space data 146 and pre-weighted k-space data 148. Thus, no signal averaging or phase correction has occurred between acquisition of the raw data and generation of the two k-space data sets 146, 148. The symmetric set of k-space data 146 corresponds to a set of acquired k-space data points that are symmetrical about a k-space axis. In certain embodiments, the pre-weighted k-space data 148 is obtained by applying a pre-weighting function to the partial k-space data 144, such that when the real part of the image data is taken, the weighting is uniform in k-space. As an example, the pre-weighting of the k-space data may be such that the high frequency portions of the k-space data are weighted more than the low frequency components. In certain embodiments, the phase of the data from the symmetric part of k-space 146 may be used for phase estimation during reconstruction.

The symmetric set of k-space data 146 and pre-weighted k-space data 148 are fast Fourier transformed (FFT) 150*a*, 150*b*, which may result in synthesis of missing data by conjugate symmetry. The Fourier transforms are followed by SENSE processing 152*a*, 152*b*. The SENSE processing 152*a*, 152*b* may generate estimated data for unsampled k-space data points using coil sensitivity information, or may refine the estimated data.

Phase correction 154 is then applied to the output of the SENSE processing 152*a*, 152*b*. As an example, the phase correction 154 may estimate, remove, and/or replace the phase from the data output of the SENSE processing 152*a*, 152*b*. Averaging 156 is then performed (e.g., magnitude averaging), which results in the real part 158 of the image data that has a Gaussian noise distribution.

Figure 5:
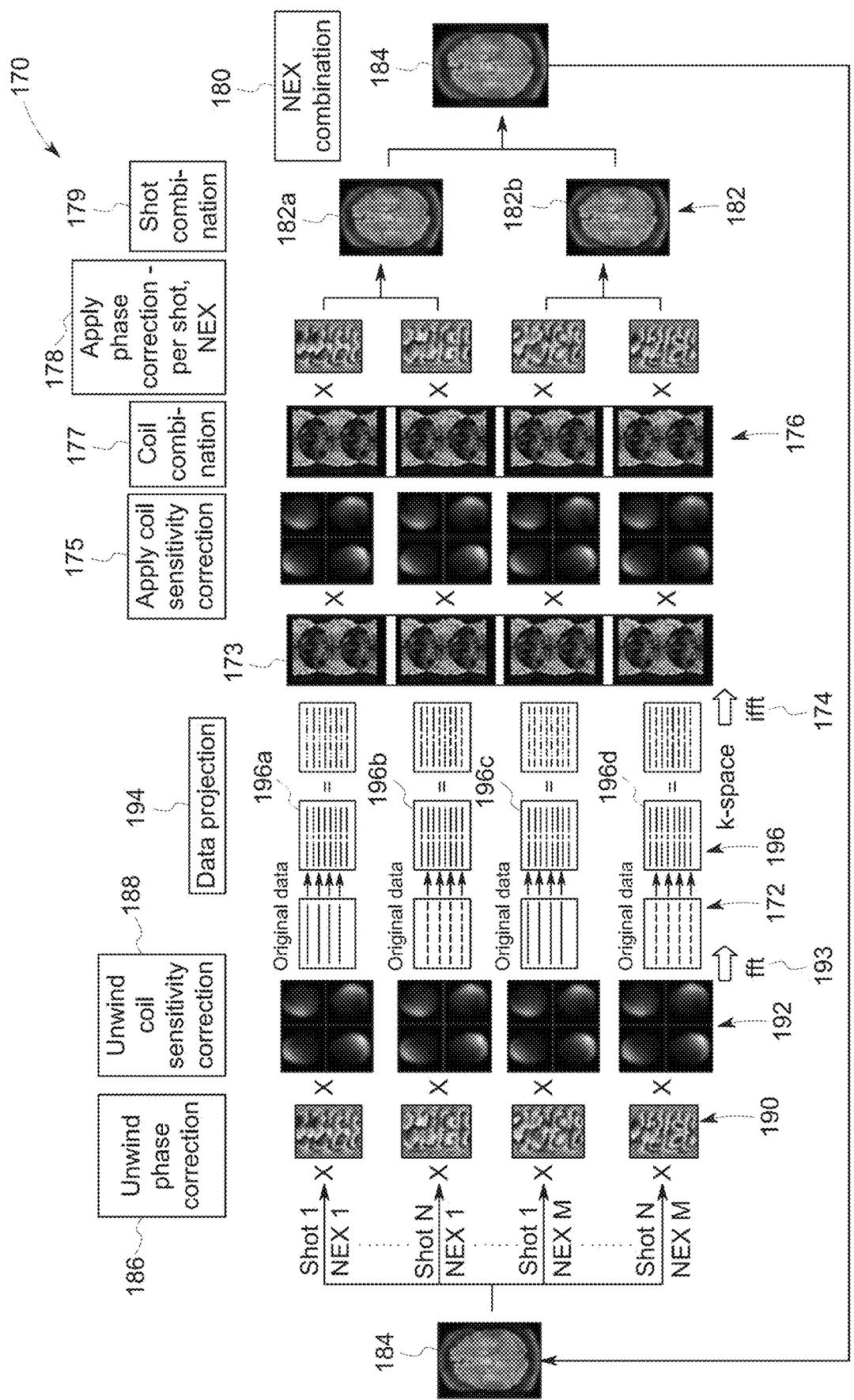
FIG. 5 is a flow diagram depicting an embodiment of a generalized framework for processing multi-shot, multi-acquisition MRI data, in accordance with an aspect of the present disclosure.

While the reconstruction algorithm 140 of FIG. 4 operates on multi-NEX raw data 142, and therefore may not include multi-shot raw data, present embodiments also include a generalized framework 170 for multi-shot and multi-acquisition (multi-NEX) imaging (e.g., diffusion weighted imaging (DWI)), which is shown in FIG. 5. In particular, FIG. 5 depicts an embodiment of the generalized framework 170 in which a magnitude constraint is applied across different acquisitions in a POCS-ICE-based reconstruction method for multi-shot, multi-acquisition DWI. However, because the method is a generalized framework, strategies other than POCS-ICE may be used.

The generalized approach set forth in FIG. 5 begins in the approximate middle of the framework 170, with original k-space data 172 (acquired k-space data 172) that has been undersampled. The acquired k-space data 172 includes data from multiple shots and multiple acquisitions, which are generically depicted in each row. The framework 170 is arranged in FIG. 5 such that Shot 1/NEX 1 to Shot N/NEX 1 corresponding to the multiple shots (from the first shot to the $N^{th}$ shot) in a single acquisition (e.g., a first acquisition, or acquisition 1). Also illustrated are rows labeled as Shot 1/NEX M to Shot N/NEX M, corresponding to the multiple shots in the $M^{th}$ acquisition. Accordingly, the framework 170 represents the first shot through the $N^{th}$ shot of each acquisition, and the first acquisition through the $M^{th}$ acquisition of the overall imaging process.

In the illustrated embodiment, parallel imaging according to the MUSE process is performed. Accordingly, an image 173 corresponding to each coil used for acquisition is produced via inverse fast Fourier Transform (iFFT) 174 of the acquired k-space data 172, and these images are corrected 175 by application of coil sensitivity information. Shot images 176 are then produced via a coil combination step 177. In certain embodiments, the coil combination step 177 may incorporate the coil sensitivity correction 175.

In certain embodiments, for example, the coil combination step 177 is done according to the following formula (1):

$$\frac{\sum_{c=1}^{N_C} x_c S_c^*}{\sum_{c=1}^{N_C} S_c S_c^*} \tag{1}$$

where $X_C$ and $S_c$ are the corresponding image and sensitivity map, respectively, of the c-th coil. The * operator corresponds to a complex conjugate. The coil combination step 177 results in a corresponding image 176 for each shot.

Once the shot images 176 are obtained, phase correction for every shot within every acquisition is applied in a phase correction step 178.

A shot combination step 179 and a NEX (acquisition) combination step 180 follow the coil combination step 177. While the shot combination step 179 is shown as immediately following the coil combination step 177 and before the NEX combination step 180, in other embodiments the shot combination step 179 and the NEX combination step 180 may be performed in the opposite order.

The shot combination step 179 to combine the shot images ($X_i$) is performed according to the following equation (2):

$$\frac{\sum_{i=1}^{N} x_i L_i^*}{N} \tag{2}$$

where $L_i^*$ is a low pass filter image containing the estimated phase. As illustrated, the shot combination step 179 produces a series of images 182 (shown as 182*a*, 182*b*), each image 182 corresponding to the shots of each acquisition. It should be noted that the shot combination step 179 is generally an averaging step. The NEX (acquisition) combination step 180 is a simple mean of the shot images ($X_j$) according to equation (3), which produces an image estimate 184:

$$\frac{\sum_{j=1}^{M} x_j}{M}. \tag{3}$$

The image estimate 184 is then used as an updated input to the remainder of the framework 170 until convergence. That is, the framework 170 is iterative, until a convergence is reached. The convergence may be represented by equation (4), where I(n) is the n-th iteration of the image estimate 184 and e is an error threshold:

$$\left| \frac{I(n+1) - I(n)}{I(n)} \right| < e. \tag{4}$$

As shown, the framework 170 includes a phase correction unwinding step 186 and a coil sensitivity correction unwinding step 188. In the phase correction unwinding step 186, the image estimate 184 is multiplied by phase information 190 (e.g., shot-specific phase terms) corresponding to each shot of each acquisition, which is shown as 190*a*, 190*b*, 190*c*, 190*d*. The shot-specific phase terms may include estimated phase based on the reconstruction process performed as a part of the SENSE or MUSE algorithm. The coil sensitivity correction unwinding step 188 involves multiplication with coil sensitivity profiles 192, shown as 192*a*, 192*b*, 192*c*, 192*d*.

A fast Fourier transform (FFT) 193 is then performed to get back from the image domain to k-space. A data projection step 194 is then performed. In the data projection step 194, the combined image 184 is used to estimate full k-space data 196 for each coil image produced from each coil of the MR imaging system, each shot, and each NEX. The acquired k-space data 172 is then projected onto the estimated full k-space data 196 by replacing corresponding estimated portions (e.g., lines) of k-space with portions (e.g., lines) of k-space that were acquired to generate full hybrid k-space data sets 197 for each image. The full hybrid k-space data sets 197, shown as 197a, 197b, 197c, 197d, replaces the acquired k-space data 172 (original data) in the framework 170 as inputs to the coil combination step 177. The process re-iterates until convergence is reached.

It should be noted that several refinements are possible to the generalized framework 170 set forth in FIG. 5. Indeed, the generalized framework 170 is amenable to incorporation of several features, such as pre-weighting of data, filtering, motion correction, and so forth.

Figure 6:
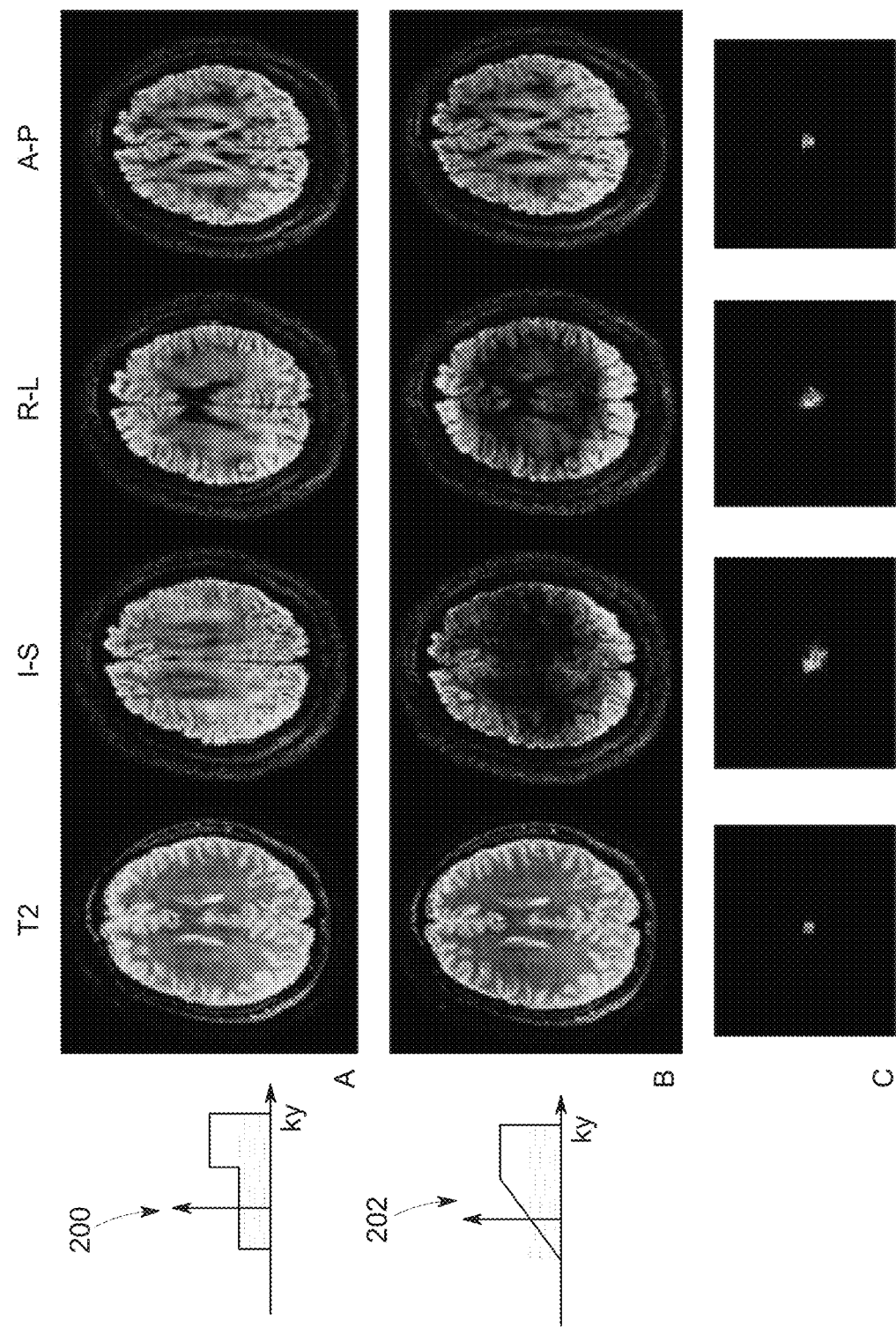
FIG. 6 is a comparison of different MRI diffusion images produced after applying different weighting functions to k-space data, in accordance with an aspect of the present disclosure.

For example, when Partial Fourier data are acquired, it may be desirable to pre-weight the data as in Homodyne reconstruction. The weighting function chosen has an impact on the final image. FIG. 6 depicts different weighting functions applied to k-space data, and images resulting from the use of such weighting functions when used in combination with the multi-shot, multi-NEX processes described herein. The data sets were produced with 4 shots and 6 NEX, and the k-space data for T2 and three diffusion directions were pre-weighted with different weighting functions, as shown in rows A and B. Row C depicts the k-space data for one coil and one NEX.

As illustrated, one possible weighting function is a step function 200, which is shown in FIG. 6, row A. However, ringing artifacts may appear due to the strong discontinuity in the weighting function, especially in its corresponding T2 image. A ramp function 202, shown in FIG. 6, row B, can be used to reduce such artifacts. As depicted in the images in row B, signal is lost in the diffusion weighted images. Indeed, due to motion between shots, the center of k-space may be shifted and the energy can be spread as can be seen in row C for the different diffusion directions. Furthermore, if not enough additional lines in k-space (ky<0) are not acquired, the center of k-space may not be sampled in the worst case and important information is lost, thereby preventing accurate estimation of the phase. Accordingly, in certain embodiments, the step weighting function 200 may be too discontinuous and the ramp weighting function 202 may be too unbalanced. In accordance with certain embodiments of the present disclosure, a smoother sigmoid function 210, shown in FIG. 7, is used to weight the data.

Figure 8:
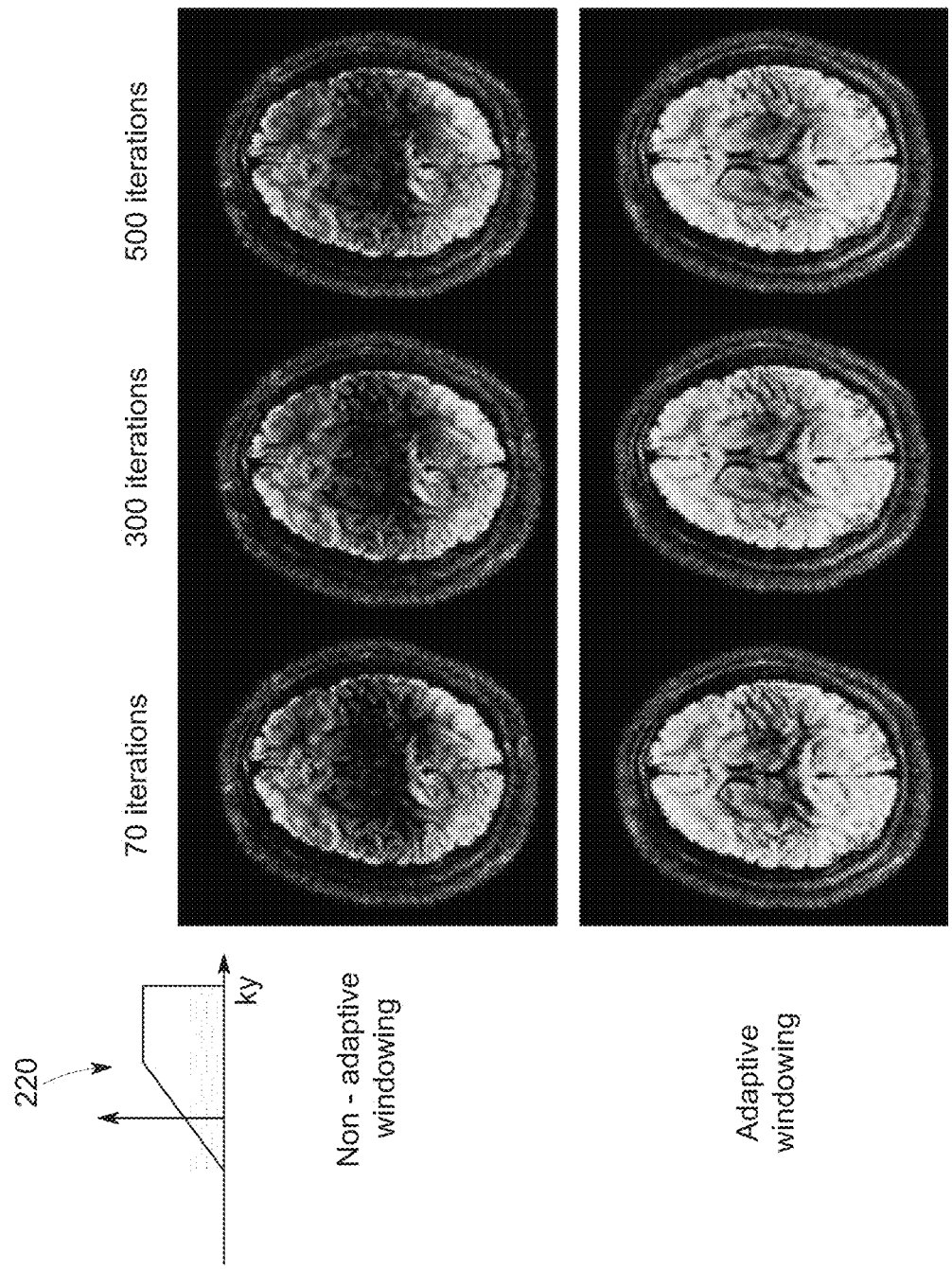
FIG. 8 is an illustration comparing different MRI diffusion images produced after applying a weighting function to k-space data with and without using adaptive windowing, in accordance with an aspect of the present disclosure.

Because there may be motion between shots, as set forth above, the center of k-space may shift, causing errors in phase estimation and so forth. Accordingly, it is now recognized that in situations where the center of k-space has been shifted but is still sampled, one way to avoid weighting the k-space incorrectly is to find where the highest energy is and shift the weighting function accordingly. This is called adaptive windowing. The impact of adaptive windowing can be seen in the case of pre-weighting with a ramp function 220, as illustrated in FIG. 8. By sliding the weighting function along one or more k-space directions, signal was recovered in a process including 4 shots and 6 NEX. The adaptive windowing was applied to the iterative multi-shot, multi-NEX reconstruction framework, showing that increasing the number of iterations did not result in convergence without the application of adaptive windowing.

Figure 9:
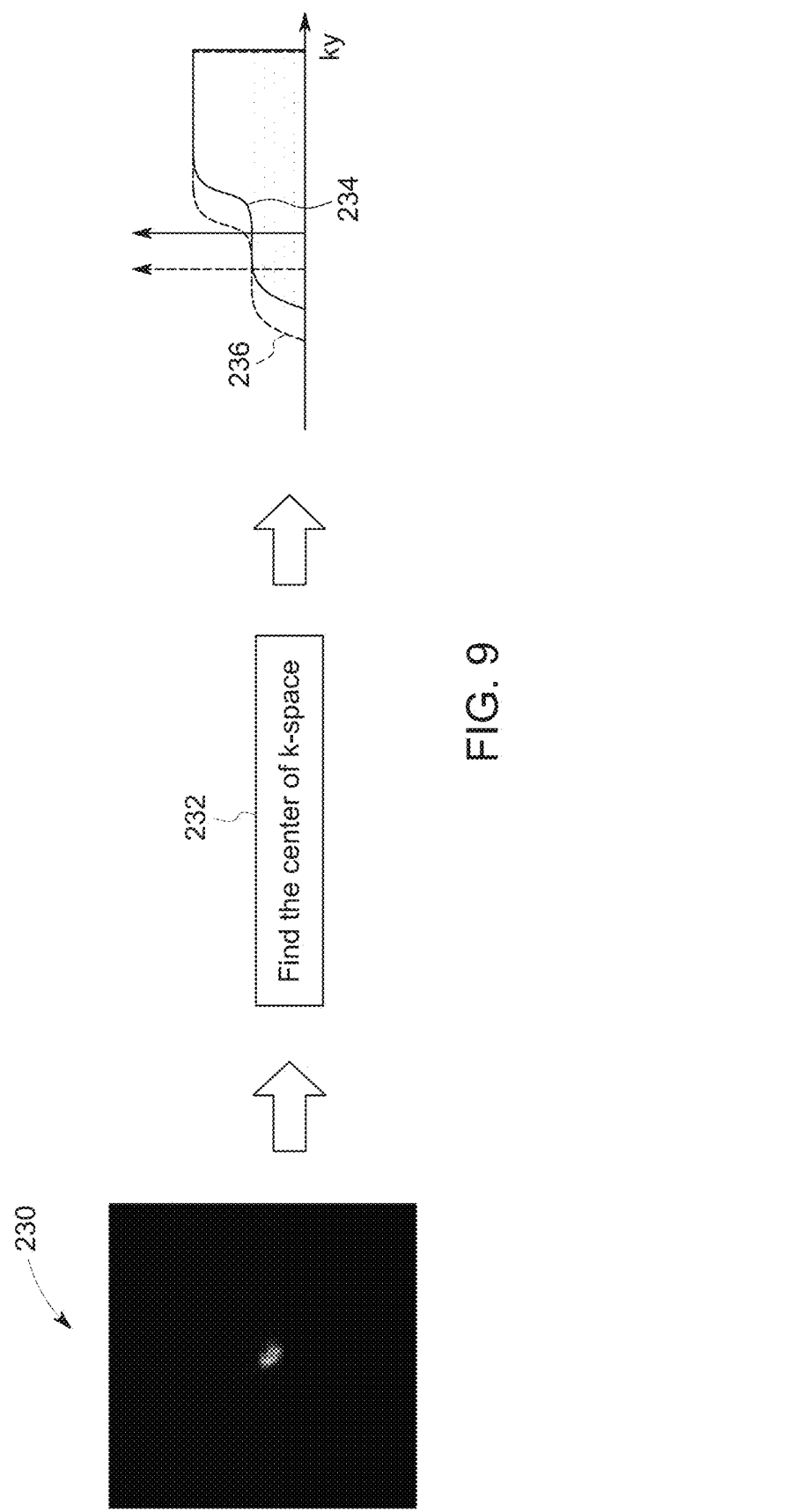
FIG. 9 is a schematic illustration of an embodiment of pre-weighting of k-space data using adaptive windowing, in accordance with an aspect of the present disclosure.

The adaptive windowing technique is more generally depicted in FIG. 9, with a k-space data example 230 having a k-space center. The technique involves finding (block 232) the center of k-space based on a determination of where the highest relative level of energy is located in the k-space FOV. The weighting function (e.g., sigmoid function 210 of FIG. 7) may be shifted from a first position 234 to a second position 236 by sliding the function along a k-space direction (in this example, the ky direction). In certain embodiments, the acts represented by block 102 in methods 100, 120 may include acquiring additional lines in k-space to determine if the k-space center has been shifted. In such embodiments, adaptive windowing is incorporated into the overall imaging methodology.

As set forth above, in certain embodiments phase estimation is performed, followed by removal of the phase from complex data to ensure Gaussian noise distribution, rather than Rician noise distribution. As described with respect to the reconstruction algorithm 140, estimated phase is obtained using the phase from the symmetric part of k-space 146.

Referring again to the generalized framework of FIG. 5, the coil combination step 177 may be performed using a regularization parameter. Specifically, this parameter is used when combining the coil images 176. During the coil combination step 177, an image or SENSE map, which applies the coil sensitivities to the images, is often not masked, which can result in amplification of noise outside of the region of interest being imaged (e.g., the brain). During that step and to avoid amplification of the noise outside of the region of interest during the normalization of the coil combination step 177, a regularization parameter may be used. It has been found that a relatively low regularization parameter (e.g., about 0.001) amplifies the noise outside of the region of interest, whereas a relatively high regularization parameter (e.g., 0.1) does not allow sufficient un-aliasing of the image. Specifically, the image intensity is reduced with a high regularization parameter, leading to down-weighting of the new estimated k-space compared to the acquired k-space. The reconstruction algorithm then converges to an aliased image, and running more iterations of the algorithm does not move away from the aliased image solution.

Figure 10:
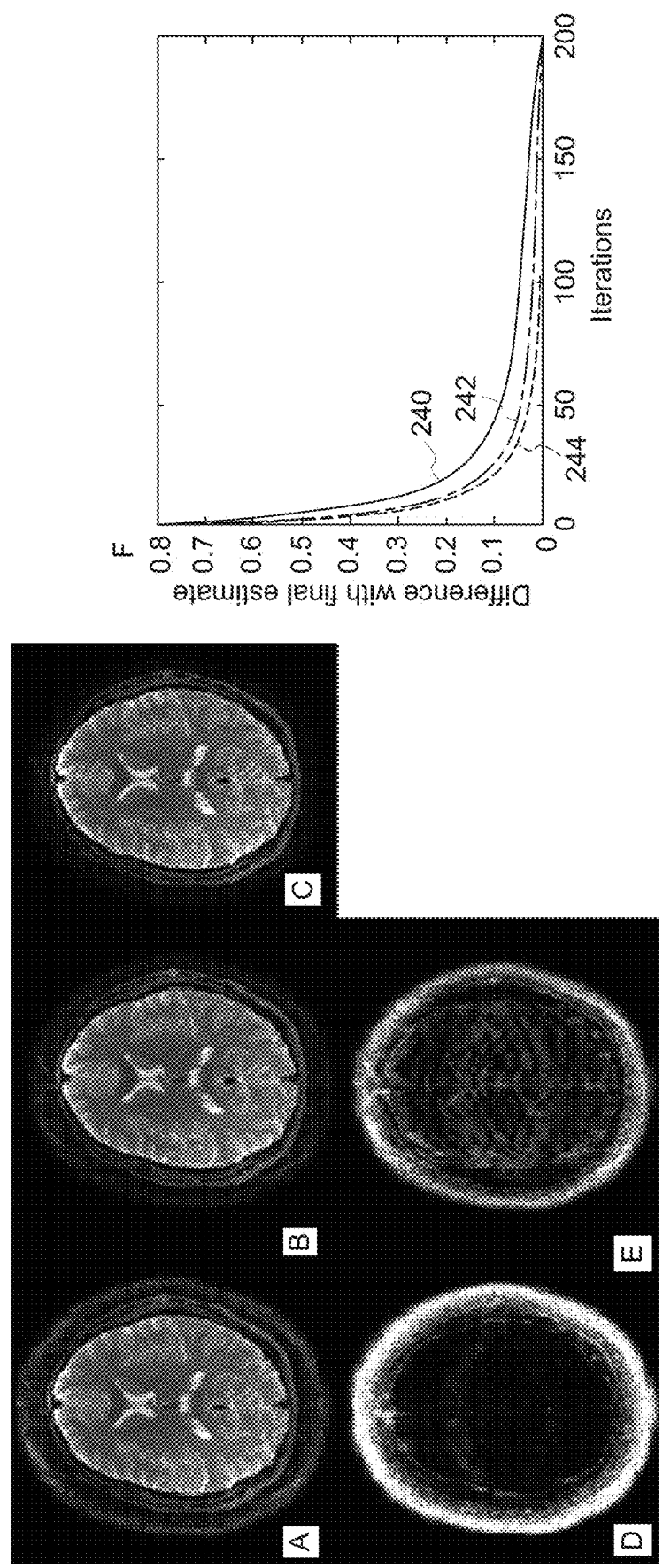
FIG. 10 is an illustration of the effect of different values for regularization parameters used for combining MRI coil images, in accordance with an aspect of the present disclosure.

To avoid regularizing too much in the region of interest and not enough outside of the brain, a regularization that is spatially dependent may be applied in accordance with present embodiments. FIG. 10 depicts the difference in images resulting from the use of different regularization parameters for images obtained using a 4-shot, 6-NEX data acquisition sequence in accordance with present embodiments.

Specifically, in FIG. 10, image A represents the coil combination image obtained using a relatively low and constant regularization parameter ($\alpha$=0.001). Image B represents the coil combination image obtained using a higher constant regularization parameter ($\alpha$=0.005). Image C represents the coil combination image obtained using a spatially-dependent regularization parameter. Image D is the absolute difference between image C and image A. Image E is the absolute difference between image C and image B. Graph F represents the difference with the final estimate for the coil combination image using the constant regularization case with $\alpha$=0.001 (image A) represented be line 240, the constant regularization case with $\alpha$=0.005 (image B) represented by line 242, and the spatially-dependent regularization case (image C) represented by line 244.

As can be seen in FIG. 10, a higher regularization parameter avoids noise amplification outside of the region of interest (e.g., the brain), but some aliasing residue remains in the image (see image E). With the spatially-dependent regularization, the reconstruction algorithm converges faster and avoids the issues with the constant regularization, resulting in much faster convergence to the final estimate (relatively fewer iterations). With $\alpha$=0.005, the reconstruction algorithm converges faster because the volume outside of the brain is down-weighted more, and therefore the aliasing is suppressed in fewer iterations.

Technical effects of the invention include the ability to do very high resolution and very high b-value diffusion images. Such images are of intense research and commercial interest, as diffusion is useful for providing biomarkers in oncology, neurology, and neuroscience. Specifically, embodiments of the present disclosure systems and methods for combining multiple shots and multiple acquisitions, while correcting for inconsistent phase between the shots and acquisitions.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A magnetic resonance (MR) imaging method performed by an MR imaging system, the MR imaging method comprising:
    acquiring k-space data in multiple shots and multiple acquisitions (NEX) using the MR imaging system, wherein each shot of the multiple shots results in the acquisition of a partial k-space data set obtained by coils of the MR imaging system, and wherein each NEX comprises a full set of the multiple shots;
    processing the k-space data using the MR imaging system according to an iterative process comprising:
        reconstructing magnitude and phase of an image from each shot and acquisition separately;
        applying a phase correction to the respective image for each shot and each acquisition;
        combining images from each shot and NEX to form a combined image;
        using the combined image to calculate full k-space data for each coil of the MR imaging system, each shot, and each NEX; and
        replacing corresponding portions of the caculated full k-space data with the acquired k-space data to generate a full hybrid k-space data set.

2. The method of claim 1, comprising iteratively reconstructing the magnitude and the phase of images corresponding to each shot and NEX in which the calculated k-space data points have replaced unacquired k-space data points.

3. The method of claim 2, wherein iteratively reconstructing the magnitude and the phase of images comprises repeatedly reconstructing the magnitude and the phase of the images corresponding to each shot and each NEX separately, removing the phase from the images, forming the combined image, calculating the unacquired k-space data points, and replacing the unacquired k-space data points with the calculated k-space data points to produce an updated input for the reconstruction of the magnitude and the phase for each of the images, and wherein the calculated k-space is iteratively updated until the combined image reaches a convergence.

4. The method of claim 1, wherein combining images from each shot and NEX to form a combined image comprises combining the NEX images, and then combining the shot images.

5. The method of claim 1, wherein combining images from each shot and NEX to form a combined image comprises combining the shot images, and then combining the NEX images.

6. The method of claim 1, comprising pre-weighting the partial k-space data sets before reconstructing the magnitude and the phase of the image from each shot and NEX separately.

7. The method of claim 6, wherein pre-weighting the partial k-space data sets comprises pre-weighting the partial k-space data sets with a spatially-dependent weighting function applied using adaptive windowing.

8. The method of claim 7, wherein the adaptive windowing comprises determining a region of k-space having the highest energy signals, and shifting the weighting function accordingly.

9. The method of claim 1, wherein acquiring k-space data in multiple shots and multiple NEX using the MR imaging system comprises performing parallel imaging acquisition for initialization, the parallel imaging acquisition being such that each NEX is acquired with less shots than required to fully sample k-space.

10. The method of claim 9, comprising using coil sensitivity information relating to coils of the MR imaging system to correct the reconstructed image for each shot and NEX.

11. The method of claim 1, wherein acquiring k-space data in multiple shots and multiple NEX using the MR imaging system comprises acquiring diffusion weighted data, and wherein applying the phase correction to the respective image for each shot and NEX results in a correction in the diffusion weighted data.

12. The method of claim 11, comprising generating an apparent diffusion coefficient (ADC) map corresponding to the multiple shots and multiple NEX based on the combined image.

13. A magnetic resonance (MR) imaging system, comprising:
    an MR scanner communicatively coupled to control and analysis circuitry, wherein the control and analysis circuitry is programmed to:
        cause the MR scanner to acquire k-space data in multiple shots and multiple acquisitions (NEX) such that each shot of the multiple shots results in the acquisition of a partial k-space data set obtained by coils of the MR imaging system, and such that each NEX comprises a full set of the multiple shots;
        reconstruct magnitude and phase of an image from each shot and acquisition separately;
        apply a phase correction to the respective image for each shot and each acquisition;
        combine images from each shot and NEX to form a combined image;
        use the combined image to calculate full k-space data for each coil of the MR imaging system, each shot, and each NEX; and
        replace corresponding portions of the calculated full k-space data with the acquired k-space data to produce a full hybrid k-space data set.

14. The MR imaging system of claim 13, wherein the control and analysis circuitry is programmed to cause the MR scanner to acquire diffusion weighted MR data in the multiple shots and multiple NEX, and wherein the control and analysis circuitry is programmed to correct the diffusion weighted MR data by applying the phase correction.

15. The MR imaging system of claim 14, wherein the control and analysis circuitry is programmed to generate an apparent diffusion coefficient (ADC) map corresponding to the multiple shots and multiple NEX based on the combined image.

16. The MR imaging system of claim 13, wherein the control and analysis circuitry is programmed to iteratively reconstruct the magnitude and the phase of images corresponding to each shot and NEX in which the calculated k-space data points have replaced unacquired k-space data pionts.

17. The MR imaging system of claim 16, wherein the control and analysis circuitry is programmed to iteratively reconstruct the MR data magnitude and the phase of images by:
  updating the images corresponding to the multiple shots and the multiple NEX using the full hybrid k-space data set;
  correcting the respective phase in the updated images;
  combining, after correction of the respective phase, the updated shot images and the updated NEX images to produce an updated combined image;
  using the updated combined image to calculate updated full k-space data for each coil, each shot, and NEX; and
  updating the full hybrid k-space data set by replacing corresponding portions of the calculated updated full k-space data with the acquired k-space data; and
  determining whether the convergence has been reached based on the updated combined image.

18. A method of correcting diffusion weighted magnetic resonance (MR) data using control and analysis circuitry associated with an MR imaging system, comprising:
  obtaining diffusion weighted MR data corresponding to multiple shots and multiple acquisitions (NEX) acquired during an MR diffusion weighted imaging acquisition sequence in which the multiple shots and multiple NEX are performed, wherein each of the multiple shots includes undersampled k-space data acquired using coils of the MR imaging system, and wherein each of the multiple NEX includes a full set of the multiple shots;
  separately reconstructing the magnitude and phase of images corresponding to the diffusion weighted MR data for the multiple shots and multiple NEX;
  applying a phase correction to each of the images;
  combining, after the phase correction, the shot images and the NEX images to produce a combined image;
  calculating full k-space data for each coil of the MR imaging system, each of the multiple shots, and each of the multiple NEX using the combined image;
  replacing corresponding portions of the calculated full k-space data with the acquired diffusion weighted MR data to produce updated diffusion weighted MR data for each of the multiple shots and each of the multiple NEX.

19. The method of claim 18, comprising iteratively updating the diffusion weighted MR data until a convergence is reached by:
  separately reconstructing, using the updated diffusion weighted MR data, updated magnitude and updated phase of updated images corresponding to the multiple shots and multiple NEX;
  removing the respective phase from each of the updated images;
  combining, after removal of the respective updated phase, the updated shot images and updated NEX images to produce an updated combined image; and
  determining whether the convergence has been reached based on the updated combined image.

* * * * *